US008427217B1

(12) United States Patent
Le Grand de Mercey et al.

(10) Patent No.: US 8,427,217 B1
(45) Date of Patent: Apr. 23, 2013

(54) PHASE INTERPOLATOR BASED ON AN INJECTED PASSIVE RLC RESONATOR

(75) Inventors: Gregoire Le Grand de Mercey, San Francisco, CA (US); Richard Booth, San Jose, CA (US)

(73) Assignee: Panasonic Corporation, Osaka (JP)

(*) Notice: Subject to any disclaimer, the term of this patent is extended or adjusted under 35 U.S.C. 154(b) by 0 days.

(21) Appl. No.: 13/434,590

(22) Filed: Mar. 29, 2012

(51) Int. Cl.
*H03H 11/16* (2006.01)

(52) U.S. Cl.
USPC .......................................... 327/231; 327/233

(58) Field of Classification Search .................. None
See application file for complete search history.

(56) References Cited

U.S. PATENT DOCUMENTS

| 5,465,064 | A  | * | 11/1995 | Shou et al. | 327/361 |
| 6,107,871 | A  | * | 8/2000  | Shin | 327/554 |
| 6,111,445 | A  |   | 8/2000  | Zerbe et al. | |
| 6,696,876 | B2 | * | 2/2004  | Drost et al. | 327/298 |
| 8,035,436 | B2 | * | 10/2011 | Ali et al. | 327/231 |
| 2011/0050312 | A1 | * | 3/2011 | Fujino | 327/237 |
| 2011/0068827 | A1 |  | 3/2011 | Ali et al. | |

OTHER PUBLICATIONS

Bulzacchelli, John F. et al.; "A 10-Gb/s 5-Tap DFE/4-Tap FFE Transceiver in 90-nm CMOS Technology"; IEEE Journal of Solid-State Circuits, vol. 41, No. 12, Dec. 2006, pp. 2885-2890.
Joshi, Sopan et al.; "A 12-Gb/s Transceiver in 32-nm Bulk CMOS"; 2009 Symposium on VLSI Circuits Digest of Technical Papers, Jun. 16-18, 2009; pp. 52-53.
Sidiropoulos, Stefanos et al.; "A Semi-Digital DLL with Unlimited Phase Shift Capability and 0.08-400MHz Operating Range"; Solid-State Circuits Conference, 1997; Digest of Technical Papers, 43$^{rd}$ ISSCC, 1997 IEEE International, pp. 332-333, 481, Feb. 6-8, 1997.

* cited by examiner

Primary Examiner — Cassandra Cox

(57) ABSTRACT

A phase interpolation circuit based on injected passive capacitances and an inductance for forming a resonator. The circuit conducts at least a first reference signal having a first phase component and a second reference signal having a second phase component shifted from the first phase component. By selectively switching the first reference signal and/or the second reference signal through one or more capacitances, an interpolated third signal having a third phase component between the first phase component and the second phase component can be generated. An inductor is connected with one or more of the capacitances for forming a resonant circuit to boost the signal level of the interpolated third signal. By utilizing resonance, an improved signal-to-noise ratio may be obtained for the interpolated third signal. An additional amplification stage, secondary to the resonant circuit, may be incorporated for further amplifying the signal level of the interpolated third signal.

19 Claims, 8 Drawing Sheets

PHASE INTERPOLATOR BASED ON AN INJECTED PASSIVE RLC RESONATOR

BACKGROUND

1. Field

The present invention relates generally to improvements in phase interpolation circuits and more particularly pertains to phase interpolation circuits based on passive phase interpolation and improvements thereto.

2. Description of the Related Art

Phase interpolation is often used in high-speed signaling circuits for generating precisely aligned clocking signals. Clocking signals oscillate between a high and a low state and are commonly incorporated for coordinating various functions or actions of connected electrical circuits. Phase interpolators are extensively used in delay locked loop (DLL) circuits, phase locked loop (PLL) circuits and many other matching delay circuits in order to provide the desired clocking phase component. Particularly in radio communications equipment, for example, in direct phase modulator radio transmitters, it is important to maintain accurate control over the phase components of these clocking signals. A phase interpolator circuit can provide such a controllable phase by producing a signal having a user-determinable or selectable phase component.

A phase interpolator circuit operates by receiving a plurality of reference input signals with different phase components and generating an output signal having a phase component based upon one or more of the reference input signals. By associating different weights to the various reference input signals and summing those weighted signals, the phase interpolator has the ability to adjust the output signal to have a phase component positioned between the phase components of the reference input signals.

Conventional phase interpolation circuits often incorporate active circuit components to perform the weighting or summation of the various currents or voltages of the reference input signals. However, not only do these active components increase the power consumption of the circuit, but also introduce errors into the generation of the output signal. These errors negatively impact the accurate control of the phase component. Moreover, active circuit components generally have high output capacitances and non-linear output impedances such that attempts to linearly weight any reference input signals with the active circuit components results in non-linear modifications of the output signal. These non-linear changes are demonstrated by deviations in the phase component of the output signal from the desired phase component. Instead of obtaining an output signal with the chosen phase component, the intrinsic nonlinearities of these active components create an output signal having a phase component with an undesired or unexpected offset.

Attempts have been made to mitigate or reduce these deviations in the output signal by using alternative circuit topologies. One attempted circuit configuration employs passive circuit components to perform the weighting on the reference input signals. Unfortunately, such circuit configurations must often trade more area, current, or a decreased interpolation resolution for any such improvements in linear output signal generation. Capacitor-based passive phase interpolation poses particular problems since the capacitive devices suppress the voltage of the circuit and thus require significant additional amplification of the output signal. Not only does such a circuit require larger amounts of power to adequately buffer the output signal for use, but also impacts the signal-to-noise ratio of the output signal due to the diminished voltage level. Capacitive components, as inherently area-based electrical devices, often must be utilized in larger sizes in order to maintain an adequately large voltage for the output signal. Such a design, however, is in direct contravention with the requirements of modern applications which increasingly demand electronic devices be manufactured in ever smaller sizes. Thus, a method or apparatus for providing a controllable phase interpolation signal with high linearity and low power consumption with the capability of delivering a high interpolation resolution is desired.

SUMMARY

An apparatus and method for generating a controllable phase component in an output signal based upon a plurality of reference input signals. In one embodiment, a phase interpolator may include a first circuit node for receiving a first signal having a first phase component and a second circuit node for receiving a second signal having a second phase component. A first capacitor has a first terminal and a second terminal, the first terminal of the first capacitor switchably coupled with the first circuit node. A second capacitor has a first terminal and a second terminal, the first terminal of the second capacitor switchably coupled with the second circuit node. A third circuit node is coupled with the second terminal of the first capacitor and the second terminal of the second capacitor, the third circuit node configured to receive a third signal having a third phase component inclusively between the first phase component and the second phase component. An inductor is coupled with the third circuit node, the inductor configured to boost a voltage of the third signal.

In yet another embodiment, a phase interpolation circuit may include a first circuit node for conducting a first reference input signal, a first switch configured to conduct at least a portion of the first reference input signal from the first circuit node when in a conducting configuration and a first capacitor configured to receive the at least a portion of the first reference input signal when the first switch is in the conducting configuration. The phase interpolation circuit may also include a second circuit node for conducting a second reference input signal having a 90 degree phase shift from the first reference input signal, a second switch configured to conduct at least a portion of the second reference input signal from the second circuit node when in a conducting configuration and a second capacitor configured to receive the at least a portion of the second reference input signal when the second switch is in the conducting configuration. The phase interpolation circuit may also include a third circuit node for conducting a third reference input signal having a 180 degree phase shift from the first reference input signal, a third switch configured to conduct at least a portion of the third reference input signal from the third circuit node when in a conducting configuration and a third capacitor configured to receive the at least a portion of the third reference input signal when the third switch is in the conducting configuration. The phase interpolation circuit may also include a fourth circuit node for conducting a fourth reference input signal having a 270 degree phase shift from the first reference input signal, a fourth switch configured to conduct at least a portion of the fourth reference input signal from the fourth circuit node when in a conducting configuration and a fourth capacitor configured to receive the at least a portion of the fourth reference input signal when the fourth switch is in the conducting configuration. The phase interpolation circuit may also include a fifth circuit node for conducting an interpolated signal having a phase component based on the configuration of the first switch, the second switch, the third switch and the fourth switch and an inductor electrically connected to the first capacitor, the second capacitor, the third capacitor and the fourth capacitor and configured to form a resonant circuit with any of the first capacitor, the second capacitor, the third capacitor or the fourth capacitor.

In yet another embodiment, a method of generating a signal with a controllable phase component may include the steps of providing a first capacitance switchably connected to a first circuit node, providing a second capacitance switchably connected to a second circuit node, receiving a first reference signal having a first phase component at the first capacitance when the first capacitance is connected to the first circuit node, receiving a second reference signal having a second phase component at the second capacitance when the second capacitance is connected to the second circuit node, generating an interpolated signal having a third phase component inclusively between the first phase component and the second phase component, the interpolated signal based on the switchable connection of the first capacitance and the second capacitance, and raising a voltage level of the interpolated signal via an inductor connected with at least one of the first capacitance or the second capacitance.

BRIEF DESCRIPTION OF THE DRAWINGS

Other systems, methods, features, and advantages of the present invention will be or will become apparent to one with skill in the art upon examination of the following figures and detailed description. It is intended that all such additional systems, methods, features, and advantages be included within this description, be within the scope of the present invention, and be protected by the accompanying claims. Component parts shown in the drawings are not necessarily to scale, and may be exaggerated to better illustrate the important features of the present invention. In the drawings, like reference numerals designate like parts throughout the different views, wherein:

DETAILED DESCRIPTION

Figure 1A:
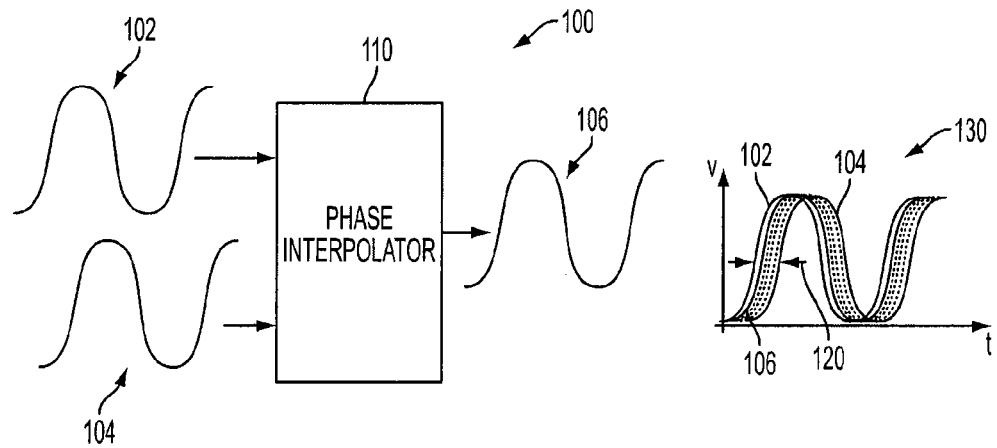
FIG. 1A is a block diagram of an output signal generated by a phase interpolator from two reference input signals in accordance with an embodiment of the invention.

In reference to FIG. 1A, a block diagram 100 is shown incorporating a phase interpolator 110. A first reference input signal 102 and a second reference input signal 104 are input into the phase interpolator 110. The first reference input signal 102 has a first phase component and the second reference input signal 104 has a second phase component. The first phase component and the second phase component of each reference input signal (102, 104) are offset or shifted with respect to one another, for example by 90 degrees. The phase interpolator 110 is designed to generate a third signal 106 having a third phase component with the third phase component being inclusively between the first phase component of the first reference input signal 102 and the second phase component of the second reference input signal 104. For example, if the first reference input signal 102 had a phase component of 0 degrees and the second reference input signal 104 had a phase component of 90 degrees, the third signal 106 could be generated to have a phase component equal to 0 degrees, equal to 90 degrees, or equal to any degree there between. As can be seen in graph 130, in one example, the first reference input signal 102 and the second reference input signal 104 have phases that are offset 120 from each other. The third signal 106 generated by the phase interpolator 110 is positioned between the first reference input signal 102 and the second reference input signal 104. Such phase interpolation may be useful for generating clocking signals that must have a determinable or otherwise controllable phase component.

Figure 1B:
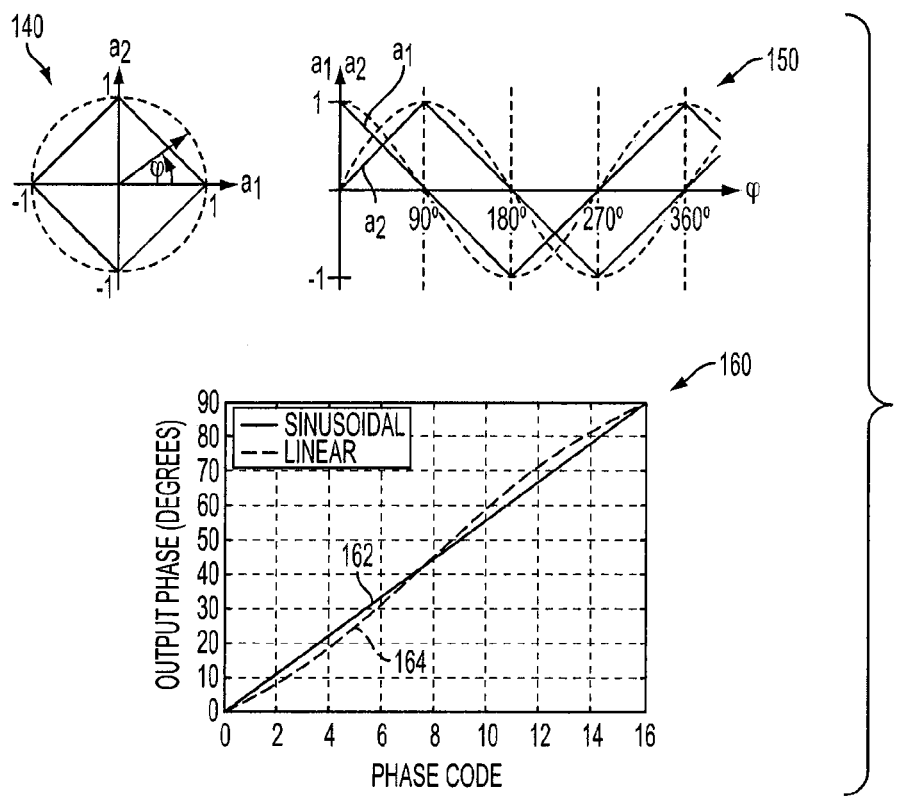
FIG. 1B is a plurality of graphs showing sinusoidal versus linear interpolation weighting for a phase interpolation circuit in accordance with an embodiment of the invention.

FIG. 1B shows a plurality of graphs indicating the differences between sinusoidal and linear interpolation weighting for a phase interpolation circuit. Phase interpolation may be accomplished by the weighting of two time-varying signals in order to generate a third time-varying signal. In general, a sinusoid signal has the following function of time (t):

$$y(t) = A\sin(\omega t - \phi)$$

where A represents the amplitude of the signal, ω represents the number of oscillations of the signal in a given time interval and ϕ represents the phase of the signal. Due to geometric relationships, this function may be written:

$$\alpha_1 * X1 + \alpha_2 * X2 \text{ where}$$

$$\alpha_1 = \cos(\phi), \alpha_2 = \sin(\phi) \text{ and}$$

$$X1 = \cos(\omega t), X2 = \sin(\omega t)$$

Thus, $\alpha_1$ and $\alpha_2$ are weights that can be controlled via a phase interpolation circuit, the quadratic sum of the weighting parameters having the following equation:

$$\alpha_1^2 + \alpha_2^2 = 1$$

This relationship is shown plotted in graphs 140 and 150 for 360 degrees of the phase component of a signal. However, in reality or practical usage, a linear weighting relationship is often used instead due to constant capacitances of the utilized circuit. This linear relationship is demonstrated by the following equation:

$$\alpha_1 + \alpha_2 = 1$$

This simplification of the quadratic sum results in an error between the ideal output phase of an interpolated signal and the actual phase obtained in the interpolated signal. For example, graph 160 plots both the sinusoidal (e.g., ideal) output phase 162 and the linear output phase 164 for a variety of weights. As can be seen, the linear output phase 164 deviates from the sinusoidal output phase 162.

Figure 2A:
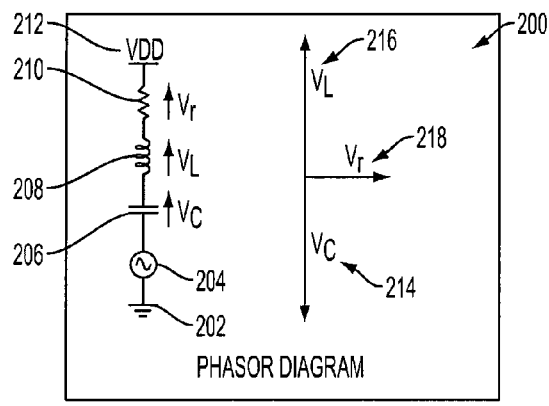
FIG. 2A is a phasor diagram for a circuit containing a reference signal, a capacitance, an inductance and a resistance in accordance with an embodiment of the invention.

Controlling the weighting applied to various reference input signals, as described in greater detail herein, allows a user to generate or obtain an output signal having a desired phase component. FIG. 2A shows a phasor diagram 200 for representing such an output signal in a simple circuit driven at its resonance frequency for introducing this process. The circuit includes a ground 202 connected to a signal generator 204 for producing a time-varying signal. A capacitance 206 is connected to the signal generator 204. An inductance 208 is connected to the capacitance 206. A resistance 210 is connected to the inductance 208 and to a voltage supply 212. The capacitance 206 has a phasor representation 214, the inductance has a phasor representation 216 and the resistance has a phasor representation 218. The resistance phasor representation 218 lies completely along the real axis of the phasor diagram 200 and thus has a phase component of 0 degrees. The capacitance phasor representation 214 lies along the negative imaginary axis of the phasor diagram 200 and thus has a phase component of −90 degrees. The inductance phasor representation 216 lies along the positive imaginary axis of the phasor diagram 200 and thus has a phase component of +90 degrees.

Figure 2B:
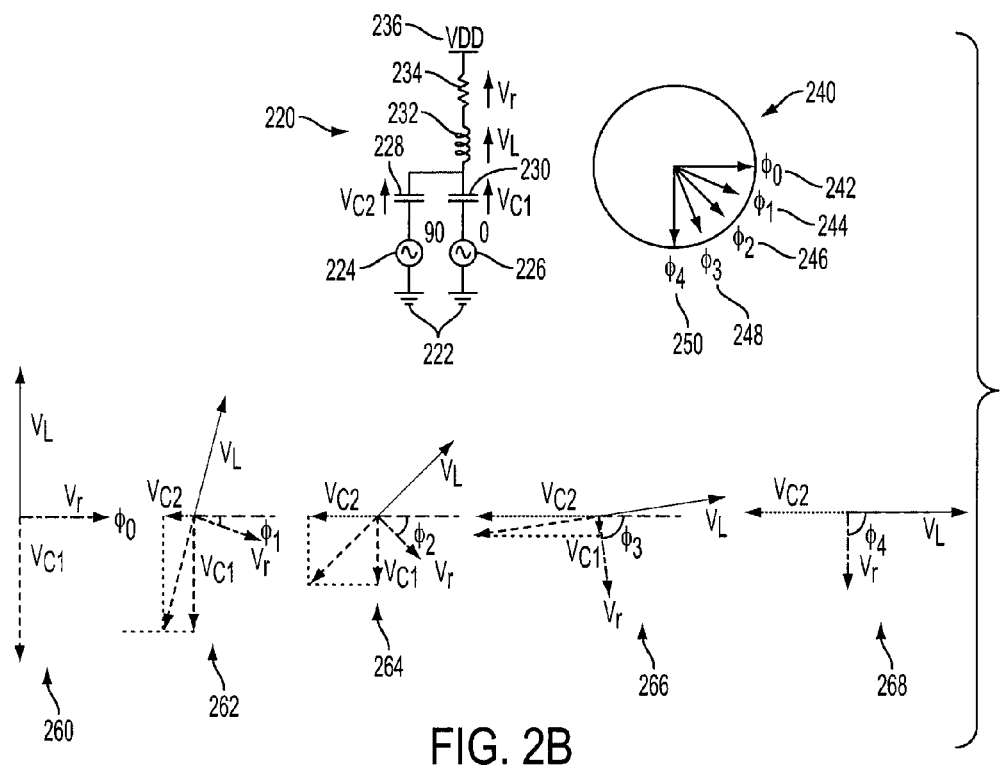
FIG. 2B is a plurality of phasor diagrams representing output signals of a phase interpolator with controllable weighting of reference signal inputs in accordance with an embodiment of the invention.

FIG. 2B demonstrates how phasor representations of capacitances, inductances, and resistances may rotate their positions in a circuit configuration with two signal generators and switchable capacitances. A circuit 220 driven at resonance includes a ground 222 connected to a first reference signal generator 224 and a second reference signal generator 226. A signal produced by the first reference signal generator 224 has a phase component that is offset by 90 degrees from a signal produced by the second reference signal generator 226. The first reference signal generator 224 is connected to a first switchable capacitance bank 228 and the second reference signal generator 226 is connected to a second switchable capacitance bank 230. The first and second switchable capacitance banks (228, 230) are connected to an inductance 232, which is connected through a resistance 234 to a supply 236.

The first and second switchable capacitance banks (228, 230) thus allow a user to control a capacitive weight assigned to each of the signal from the first reference signal generator 224 and the signal from the second reference signal generator 226. By manipulating the switched configuration of the first or second switchable capacitance banks (228, 230) to the first or second reference signal generators (224, 226), the weight applied to each of the signal from the first reference signal generator 224 or the signal from the second reference signal generator 226 may be controlled. In this manner, a user may obtain a desired phase component at an output of the capacitance banks (228, 230), as described in greater detail herein.

A plurality of phasor diagrams (260, 262, 264, 266, 268) are shown, one for each of a plurality of phase angles (242, 244, 246, 248, 250) shown in angular plot 240. For the first phasor diagram 260, the first switchable capacitance bank 228 has none of its capacitance electrically connected with the first reference signal generator 224 (i.e. it is fully switched off). The second switchable capacitance bank 230, however, has all of its capacitance electrically connected to the second reference signal generator 226 (i.e. it is fully switched on). Thus, the applied capacitive weighting results in the first phasor diagram 260 positioned according to the first phase angle 242 (i.e. 0 degrees offset) because only the signal from the second reference signal generator 226 (having a 0 degree phase component) is permitted to influence the output. For the second phasor diagram 262, the first switchable capacitance bank 228 has at least some of its capacitance electrically connected with the first reference signal generator 224 (i.e. it is partially switched on). The second switchable capacitance bank 230 also has at least some of its capacitance electrically connected to the second reference signal generator 226. A greater amount of capacitance is applied to the second reference signal generator 226 than the first reference signal generator 224. Therefore, the applied capacitive weighting results in the addition of both the signal from the second reference signal generator 226, which has a 0 degree (i.e. in-phase) phase component, and the signal from the first reference signal generator 224, which has a 90 degree (i.e. quadrature) phase component. This combination is demonstrated in the second phasor diagram 262 that has been rotated according to the second phase angle 244.

In a similar fashion, the third phasor diagram 264 is rotated according to the third phase angle 246. This may occur, for example, when half of the capacitance of the first switchable capacitance bank 228 is electrically connected to the first reference signal generator 224 and half of the capacitance of the second switchable capacitance bank 230 is electrically connected to the second reference signal generator 226. Thus, the applied capacitive weighting results in an obtained phase angle directly in the middle (e.g. 45 degrees) of the phase components of the signals from the first and second signal generators (224, 226). Likewise, the fourth phasor diagram 266 is rotated according to the fourth phase angle 248, similar to the second phasor diagram 262, but the first switchable capacitance bank 228 now has greater amounts of capacitance connected to the first reference signal generator 224 than the second switchable capacitance bank 230 has connected to the second reference signal generator 226. The fifth phasor diagram 268 represents an applied capacitive weighting configuration where the first switchable capacitance bank 228 has all of its capacitance electrically connected with the first reference signal generator 224 (i.e. it is fully switched on) while the second switchable capacitance bank 230 has none of its capacitance electrically connected to the second reference signal generator 226 (i.e. it is fully switched off), thus resulting in a phase angle 250 rotation of 90 degrees.

Figure 3:
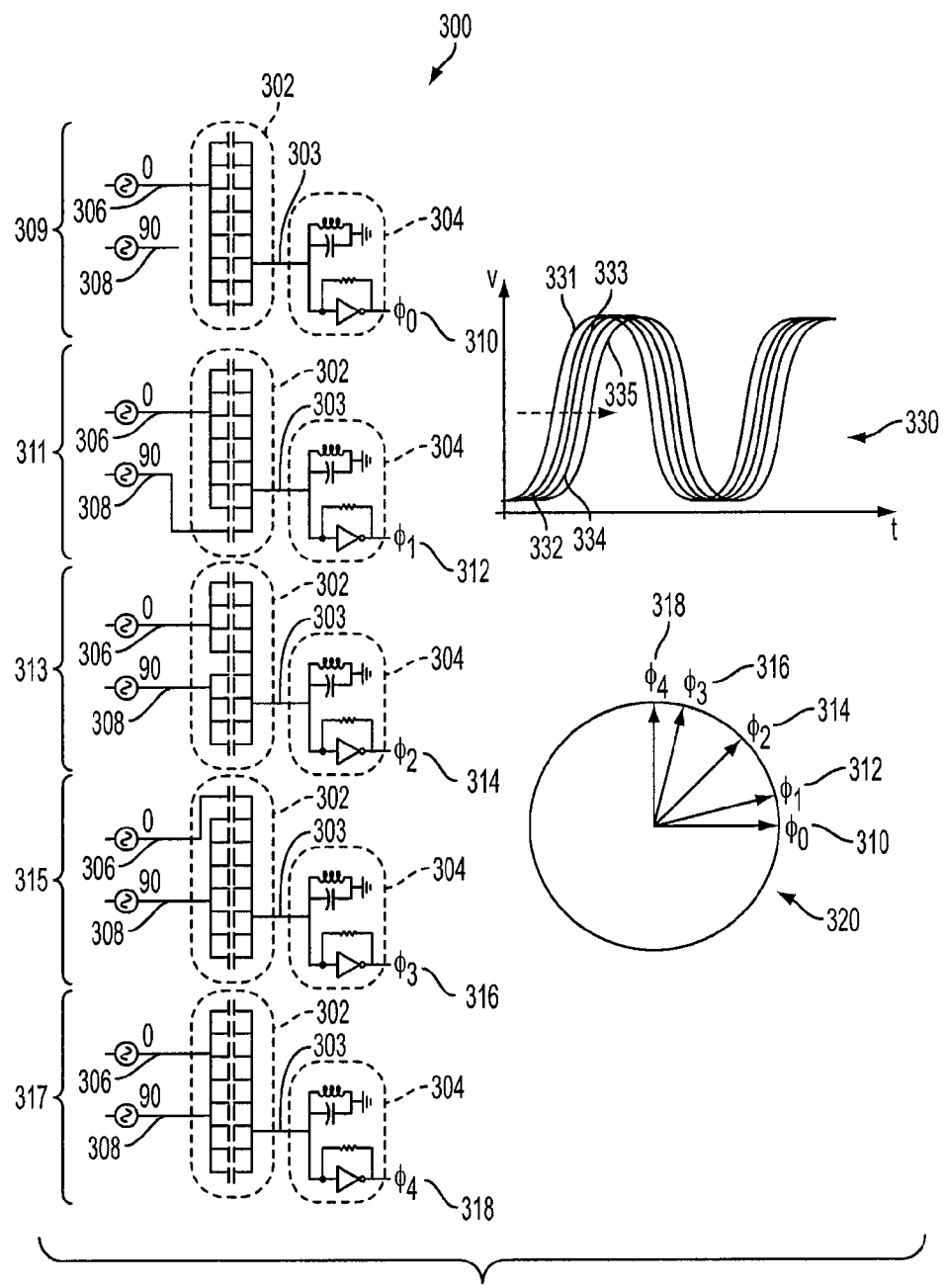
FIG. 3 is a circuit schematic diagram of a two quadrant phase interpolator utilizing capacitive injection with passive inductor-based amplification in accordance with an embodiment of the invention.

Turning next to FIG. 3, a phase interpolation circuit 300 utilizing capacitive injection with passive inductor-based amplification is shown in five different capacitively weighted configurations (309, 311, 313, 315, 317). The phase interpolation circuit 300 includes a number of different electrical components, such as capacitors, inductors, resistors, and amplifiers. For illustrative purposes, the phase interpolation circuit 300 will be described with reference to specific configurations of the different electrical components shown to achieve specific phase interpolation capabilities. However, other electrical components may be used or may be connected in varying configurations to achieve other phase interpolation characteristics. For example, greater or fewer capacitors may be utilized an in alternative embodiment. Thus, the capacitors, inductors, resistors, and amplifiers are merely used to illustrate an embodiment of the invention and not to limit the present invention.

The phase interpolation circuit 300 includes a first circuit node 306 for receiving or conducting a first reference input signal and a second circuit node 308 for receiving or conducting a second reference input signal. The first reference input signal and the second reference input signal are phase shifted with respect to each other by 90 degrees (e.g., the first circuit node conducts a signal having a first phase component of 0 degrees and the second circuit node conducts a signal having a second phase component of 90 degrees). The first circuit node 306 and the second circuit node 308 are switchably coupled with a capacitor bank 302.

The capacitor bank 302 includes a plurality of capacitors, each of the plurality of capacitors having a first terminal and a second terminal. The first terminal of each of the plurality of capacitors is switchably coupled with the first circuit node 306 and/or the second circuit node 308, for example via a switch that has a conducting configuration and a non-conducting configuration. This switch may be a transistor or any other switchable element that permits a switchable coupling to one or more of the plurality of capacitors of the capacitor bank 302. One or more of the plurality of capacitors may be switchably connected to both the first circuit node 306 and the second circuit node 308. By manipulating the switchable coupling of the plurality of capacitors of the capacitor bank 302 to the first circuit node 306 or the second circuit node 308, the first reference signal and/or the second reference signal may be controllably weighted by the plurality of capacitors to generate a third, interpolated signal having a third phase component inclusively between the first phase component and the second phase component, as discussed in greater detail herein. A third circuit node 303 is coupled with the second terminal of each of the plurality of capacitors of the capacitor bank 302. This third circuit node 303 receives or conducts the third signal from the capacitor bank 302 to additional circuit elements 304 for boosting or amplifying the signal level, as discussed in greater detail herein in FIGS. 4-6. The total capacitance value applied to the first circuit node 306 and to the second circuit node 308 is constant regardless of the capacitively weighted configuration (309, 311, 313, 315, 317) in order to keep the phase interpolation circuit 300 in resonance via one or more of the additional circuit elements 304. Moreover, feed-through error is eliminated or substantially reduced since all capacitor paths are used for all of the capacitively weighted configurations (309, 311, 313, 315, 317).

Looking initially to the first capacitive configuration 309, the phase interpolation circuit 300 is shown in operation when the capacitor bank 302 has been controlled to provide an interpolated signal at the third circuit node 303 having a phase angle 310 of 0 degrees. A radial plot 320 thus shows the phase angle 310 corresponding to a 0 degree position. To achieve this interpolated signal, all eight of the plurality of capacitors of the capacitor bank 302 are electrically connected to the first circuit node 306 that conducts the first reference signal with the first phase component of 0 degrees. None of the plurality of capacitors of the capacitor bank 302 are electrically connected with the second circuit node 308 that conducts the second reference signal with the second phase component of 90 degrees. The interpolated signal output from the capacitor bank 302 and received at the third circuit node 303 thus has a phase component entirely generated via the first reference signal having the 0 degree phase component. This interpolated signal is thus shown as a first interpolated signal 331 on the time-varying graph 330. As will be seen in the remaining capacitive configurations (311, 313, 315, 317), the addition of the second reference signal having the 90 degree phase component results in a controllable phase shift of the interpolated signal present at the third circuit node 303.

In the second capacitive configuration 311, the phase interpolation circuit 300 is now shown in operation when the capacitor bank 302 has been controlled to provide an interpolated signal at the third circuit node 303 having a phase angle 312 of 11.25 degrees. The radial plot 320 thus shows the phase angle 312 corresponding to an 11.25 degree position. To achieve this interpolated signal, seven of the plurality of capacitors of the capacitor bank 302 are electrically connected to the first circuit node 306 that conducts the first reference signal with the first phase component of 0 degrees and one of the plurality of capacitors of the capacitor bank 302 is electrically connected with the second circuit node 308 that conducts the second reference signal with the second phase component of 90 degrees. The interpolated signal output from the capacitor bank 302 and received at the third circuit node 303 thus has a phase component generated via the weighted summation of the first reference signal and the second reference signal. This interpolated signal is shown as a second interpolated signal 332 on the time-varying graph 330. The second interpolated signal 332 is shifted in phase from the first interpolated signal 331 by 11.25 degrees.

In the third capacitive configuration 313, the phase interpolation circuit 300 is next shown in operation when the capacitor bank 302 has been controlled to provide an interpolated signal at the third circuit node 303 having a phase angle 314 of 45 degrees. The radial plot 320 thus shows the phase angle 314 corresponding to a 45 degree position. To achieve this interpolated signal, four of the plurality of capacitors of the capacitor bank 302 are electrically connected to the first circuit node 306 that conducts the first reference signal with the first phase component of 0 degrees and four of the plurality of capacitors of the capacitor bank 302 are electrically connected with the second circuit node 308 that conducts the second reference signal with the second phase component of 90 degrees. The interpolated signal output from the capacitor bank 302 and received at the third circuit node 303 thus has a phase component generated via the weighted summation of the first reference signal and the second reference signal. In this configuration, since the capacitive weighting is equal for the first circuit node and the second circuit node, an interpolated signal is produced with a phase component directly in the middle of the phase components of the two reference signals. This interpolated signal is shown as a third interpolated signal 333 on the time-varying graph 330. The third interpolated signal 333 is shifted in phase from the first interpolated signal 331 by 45 degrees.

In the fourth capacitive configuration 315, the phase interpolation circuit 300 is shown in operation when the capacitor bank 302 has been controlled to provide an interpolated signal at the third circuit node 303 having a phase angle 316 of 78.75 degrees. The radial plot 320 thus shows the phase angle 316 corresponding to a 78.75 degree position. To achieve this interpolated signal, only one of the plurality of capacitors of the capacitor bank 302 is electrically connected to the first circuit node 306 that conducts the first reference signal with the first phase component of 0 degrees and seven of the plurality of capacitors of the capacitor bank 302 are electrically connected with the second circuit node 308 that conducts the second reference signal with the second phase component of 90 degrees. This positioning is similar to, but opposite of, the capacitive configuration 311 previously discussed. The interpolated signal output from the capacitor bank 302 and received at the third circuit node 303 thus has a phase component generated via the weighted summation of the first reference signal and the second reference signal. This interpolated signal is shown as a fourth interpolated signal 334 on the time-varying graph 330. The fourth interpolated signal 334 is shifted in phase from the first interpolated signal 331 by 78.75 degrees.

Lastly, in the fifth capacitive configuration 317, the phase interpolation circuit 300 is shown in operation when the capacitor bank 302 has been controlled to provide an interpolated signal at the third circuit node 303 having a phase angle 318 of 90 degrees. The radial plot 320 thus shows the phase angle 318 corresponding to a 90 degree position. When quantizing a first quadrant of the radial plot 320 from 0-90 degrees, the phase angle 318 actually corresponds to a first phase angle for a second quadrant of the radial plot 320 (i.e., from 90-180 degrees). Thus, the radial plot 320 has the first quadrant quantized outputs ranging from 0 degrees to 78.75 degrees in 11.25 degree increments. To achieve this interpolated signal, none of the plurality of capacitors of the capacitor bank 302 are electrically connected to the first circuit node 306 that conducts the first reference signal with the first phase component of 0 degrees and all of the plurality of capacitors of the capacitor bank 302 are electrically connected with the second circuit node 308 that conducts the second reference signal with the second phase component of 90 degrees. This situation is similar to, but opposite of, the capacitive configuration 309 previously discussed. The interpolated signal output from the capacitor bank 302 and received at the third circuit node 303 thus has a phase component entirely generated via the second reference signal having the 90 degree phase component. This interpolated signal is shown as a fifth interpolated signal 335 on the time-varying graph 330. The fifth interpolated signal 335 is shifted in phase from the first interpolated signal 331 by 90 degrees.

As shown, by switching the various capacitances connected to the first or second circuit nodes (306, 308), an interpolated signal may be generated with a desired or controlled phase component. Utilizing a greater number of switchably coupled capacitive devices results in greater resolution of the phase interpolator. For example, while the phase interpolation circuit 300 only includes 8 capacitors as part of the capacitor bank 302 and thus has a 3-bit resolution capable of eight possible phase outputs in increments of 11.25 degrees, an alternative phase interpolation circuit incorporating a larger amount of switched capacitors may be designed to use any resolution for increasingly smaller increments of phase. Such increased resolution (e.g., 9-bits) may provide increased accuracy for obtaining desired interpolated signals, but may increase manufacturing cost. In an alternative embodiment, capacitive weighting may also be scaled such that it follows the sinus and cosinus in order to achieve precise phase interpolation.

In addition, while the capacitor bank 302 of the phase interpolation circuit 300 is shown as a single capacitor bank having eight capacitors, alternative circuit configurations may be used, for example, by having multiple capacitor banks with greater or fewer numbers of capacitors. In another embodiment, each capacitor may be independent such that no capacitor banks are used. In still another embodiment, variable capacitances may be used in place of or in addition to discrete capacitor elements such that the capacitance connected to a circuit node may be variable in ways other than merely connecting or disconnecting the capacitive element as a whole through a switching device.

Moreover, the capacitive weighting may be applied in any of a variety of potential formats. For example, the plurality of capacitors used in the capacitor bank 302 may all have the same value (i.e., have a thermometer format) as previously described for the operation of the phase interpolation circuit 300. Using this thermometer format, obtaining a phase angle directly in the middle of two reference signals requires an equal number of capacitors electrically connected to each of the two reference signals. In an alternative format, one or more of the plurality of capacitors used in the capacitor bank 302 may have different values with respect to one another.

In one example of such an alternative configuration, a binary format may be utilized. Using the binary format, for example, a second capacitor may have a capacitance value that is two times larger than a first capacitor, a third capacitor may have a capacitance value that is four times larger than the first capacitor, a fourth capacitor may have a capacitance value that is eight times larger than the first capacitor, etc. Different formats may provide means of utilizing fewer capacitive elements but at potentially more complicated control methodologies. In yet another alternative embodiment, the amplitude of a voltage for driving one or more weighting capacitors may be constant or may itself be encoded in a thermometer, binary, or other format.

Figure 4:
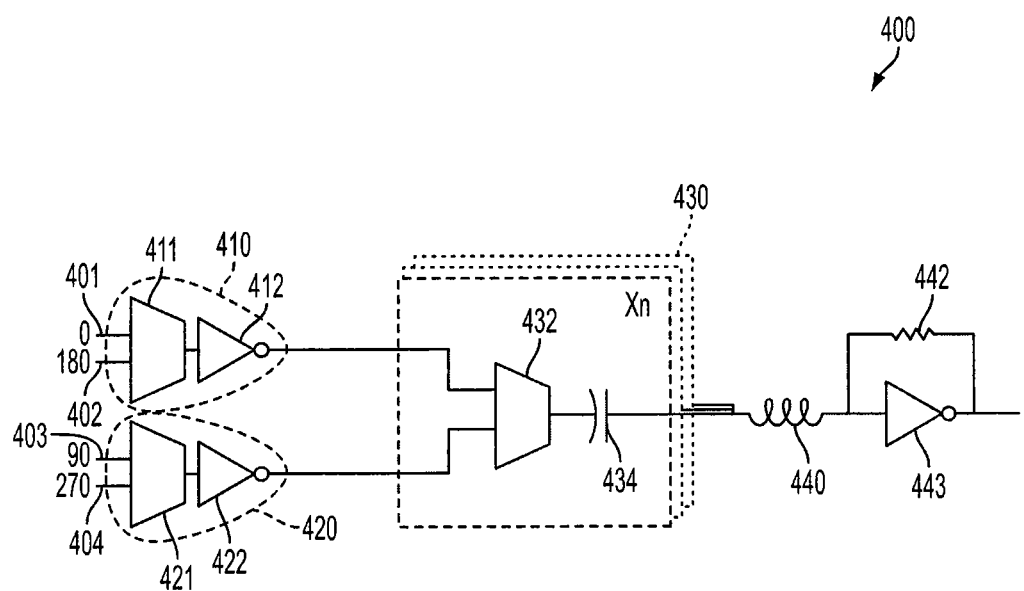
FIG. 4 is a circuit schematic diagram of a four quadrant phase interpolator utilizing capacitive injection and passive inductor-based amplification in accordance with an embodiment of the invention.

Turning next to FIG. 4, a circuit schematic diagram 400 is shown of a four quadrant phase interpolator utilizing capacitive injection and passive inductor-based amplification. A first circuit node 401 for receiving or conducting a first reference signal with a 0 degrees phase component is connected to a first multiplexor 411. A second circuit node 402 for receiving or conducting a second reference signal with a 180 degrees phase component is also connected to the first multiplexor 411. The first multiplexor 411 is connected to a buffer 412 and forms a first signal selection portion 410 for selectively propagating either the first reference signal from the first circuit node 401 or the second reference signal from the second circuit node 402 to other components of the four quadrant phase interpolator.

Similarly, a third circuit node 403 for receiving or conducting a third reference signal with a 90 degrees phase component is connected to a second multiplexor 421 and a fourth circuit node 404 for receiving or conducting a fourth reference signal with a 270 degrees phase component is also connected to the second multiplexor 421. The second multiplexor 421 is connected to a buffer 422 and forms a second signal selection portion 420 for selectively propagating either the third reference signal from the third circuit node 403 or the fourth reference signal from the fourth circuit node 404 to other components of the four quadrant phase interpolator.

A plurality of capacitors 434 and associated switches 432 make up the signal weighting portion 430 of the circuit schematic diagram 400. The same or similar to the previous discussion for FIG. 3, by controlling which of the capacitors 434 are electrically connected with one or more of the first circuit node 401, the second circuit node 402, the third circuit node 403, and/or the fourth circuit node 404 via the switches 432, an interpolated signal having a user-controllable phase component may be generated. While the embodiment shown for FIG. 3 only showed control of a phase component between 0 and 90 degrees, the four quadrant phase interpolator of FIG. 4 permits control of the phase component over the entire 360 degree range via selective switching of the first circuit node 401, the second circuit node 402, the third circuit node 403, and/or the fourth circuit node 404 via the switches 411, 421 and/or 432.

In an alternative embodiment, any of a variety of signal selection methods or configurations may be used in place of or in addition to the first and/or second signal selection portions (410, 420) or the associated switches 432 for controlling which of the first circuit node 401, the second circuit node 402, the third circuit node 403, and/or the fourth circuit node 404 is electrically connected to various of the capacitors 434. For example, a first switch may be configured to switchably connect the first circuit node 401 to a first capacitor, a second switch may be configured to switchably connect the second circuit node 402 to a second capacitor, a third switch may be configured to switchably connect the third circuit node to a third capacitor and a fourth switch may be configured to switchably connect the fourth circuit node 404 to a fourth capacitor. Switching components may be implemented as transistors or as any other type of device or component capable of forming a switchable conductive pathway between one or more of the circuit nodes (401, 402, 403, 404) and one or more of the capacitances 434.

An inductor 440 is connected to the output of the weighting portion 430 in order to mitigate the suppression of the interpolated signal voltage caused by the passive capacitive injection via the capacitors 434. The inductor 440 is designed to cooperate with one or more of the capacitors 434 to form a resonant circuit that boosts or raises a voltage or current level of the interpolated signal. Without such inductance, the phase interpolator must rely exclusively on a separate active amplifier stage to achieve any desired increase in the interpolated signal level to a usable range. Such active amplification increases the power consumption, particularly when solely responsible for obtaining useable output levels, and magnifies errors in the linear interpolation, thus reducing the signal-to-noise ratio. By incorporating the inductor 440 after the weighting portion 430 the voltage swing of the interpolated signal may be restored without requiring such heavy reliance upon an active amplification stage. This improved interpolated signal may then be used directly or can be propagated through an additional or secondary amplification stage including an amplifier 443 and resistor 442 if further bolstering of the signal is required.

Thus, the phase interpolation circuit 300 may operate at low power due to both the passive interpolation operation via the capacitors 434 combined with the passive signal amplification due to the inductor 440. By utilizing the inductor 440 at resonance to drive an output, a low supply voltage may be used for the phase interpolation circuit 300 while still ensuring sufficient or useable signal levels at the output. In addition, interpolation resolution may be high and the linearity of the interpolation is maintained due to the small number of active devices and real impedances when the phase interpolation circuit 300 is operated at resonance. The components utilized may also allow for manufacturing that is compatible with deep sub-micron processes. Furthermore, in an alternative embodiment, such as a circuit with multiple frequency operation, the resonant circuit formed via the inductor 440 may be tuned in accordance, such as by providing one or more switched or variable tuning capacitances connected in parallel with the inductor 440, as described in greater detail herein.

Figure 5:
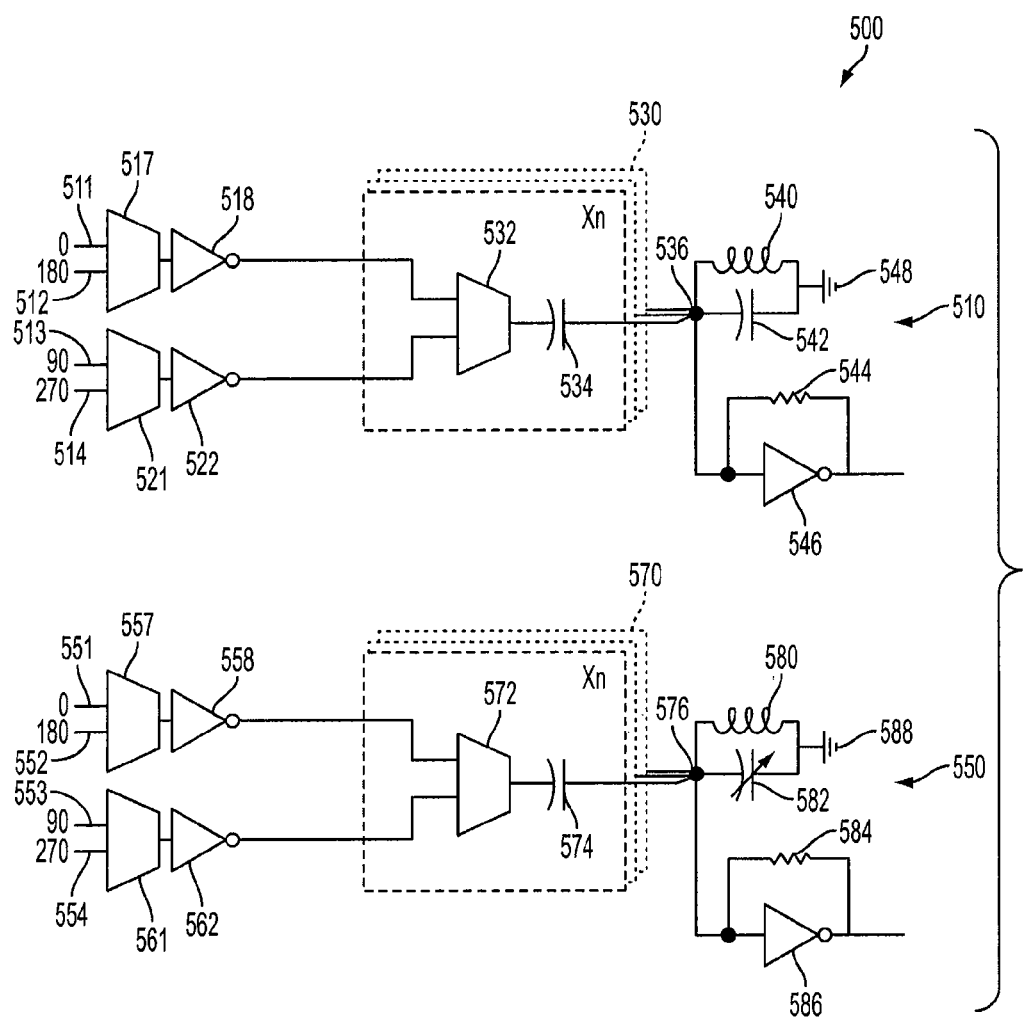
FIG. 5 is a plurality of alternative circuit schematic diagrams of phase interpolators utilizing capacitive injection with passive inductor-based amplification in accordance with an embodiment of the invention.

FIG. 5 shows a plurality of alternative circuit schematic diagrams 500 of four quadrant phase interpolator circuits utilizing capacitive injection with passive inductor-based amplification. Both a first alternative circuit schematic diagram 510 and a second alternative circuit schematic diagram 550 may have the same or similar aspects as the circuit schematic diagram 400 discussed above for FIG. 4. As discussed in greater detail below, the first alternative circuit schematic diagram 510 and the second alternative circuit schematic diagram 550 are primarily distinguished via their configuration of an inductor and amplifier after a capacitive weighting portion of the respective circuits.

The first alternative circuit schematic diagram 510 includes a first circuit node 511, a second circuit node 512, a third circuit node 513 and a fourth circuit node 514 switchably connected to a plurality of capacitors 534 through multiplexors (532, 517, 521) and buffers (518, 522), the same or similar to as previously described in FIG. 4. A weighting portion 530 operates to create an interpolated signal with a controllable phase component, the same or similar to as previously described in FIG. 4. An inductor 540 is connected in parallel with a tuning capacitor 542 between a fifth circuit node 536 and a ground connection 548 for forming a resonant circuit with any of the one or more capacitors 534. The tuning capacitor 542 may be selected or designed so as to tune or control a frequency of the resonant circuit. In one embodiment, the tuning capacitor 542 may be one or more capacitors switchably connected in parallel with the inductor 540 for tuning the resonant frequency in a multi-frequency circuit. In certain embodiments, the tuning capacitor 542 may be controlled via an input or feedback signal corresponding to a desired frequency of operation for the multi-frequency circuit. A secondary amplifier or buffer 546 connected in parallel with a resistor 544 is connected with the inductor 540 for further amplifying the signal level of the interpolated signal at the fifth circuit node 536.

The second alternative circuit schematic diagram 550 is similar to the first alternative circuit schematic diagram 510 and includes a first circuit node 551, a second circuit node 552, a third circuit node 553 and a fourth circuit node 554 switchably connected to a plurality of capacitors 574 through multiplexors (572, 557, 561) and buffers (558, 562). A weighting portion 570 operates to create an interpolated signal with a controllable phase component. An inductor 580 is connected in parallel with a variable tuning capacitor 582 between a fifth circuit node 576 and a ground connection 588 for forming a resonant circuit with any of the one or more capacitors 574. The variable tuning capacitor 582 may allow for the tuning of a frequency of the resonant circuit, similar to the tuning capacitor 542 of the first alternative circuit diagram 510, but may not require a switchable connection with the inductor 580. For example, depending upon the desired frequency of the circuit or connection of the capacitors 574 of the weighting section 570 to the first circuit node 551, the second circuit node 552, the third circuit node 553 and/or the fourth circuit node 554, the variable tuning capacitor 582 may have its capacitance controlled to provide optimal signal boosting via the resonant circuit. A secondary amplifier or buffer 586 connected in parallel with a resistor 584 is connected with the inductor 580 for further amplifying the signal level of the interpolated signal at the fifth circuit node 576.

Figure 6:
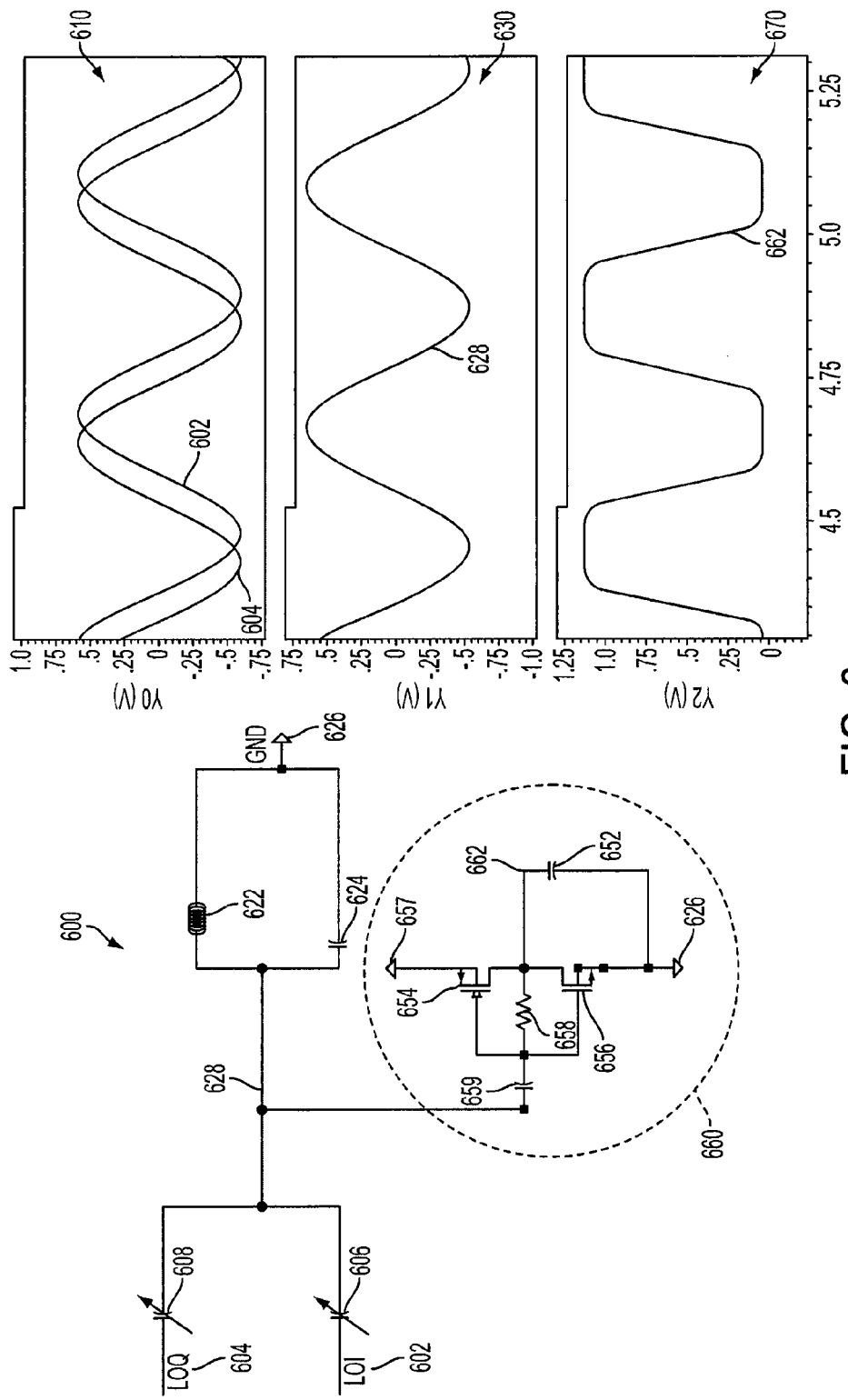
FIG. 6 is a circuit schematic diagram with associated signal plots of a phase interpolator utilizing capacitive injection with passive inductor-based amplification in accordance with an embodiment of the invention.

Turning next to FIG. 6, a circuit schematic diagram 600 and associated signal plots (610, 630, 670) are shown for a phase interpolator utilizing capacitive injection with passive inductor-based amplification. The circuit schematic diagram 600 may be the same or similar to aspects of the circuit schematic diagram 400 discussed above for FIG. 4 or the alternative circuit schematic diagrams 500 discussed above for FIG. 5. A first input signal 602 (e.g., an in-phase signal) is connected with a first controllable capacitance 606 and a second input signal 604 (e.g., a quadrature-phase signal) is connected with a second controllable capacitance 608. A graph 610 shows the first input signal 602 and the second input signal 604 as a function of time. By controlling the first and/or second capacitances (606, 608), an interpolated signal 628 is achieved at an output of the first and second capacitances (606, 608). A graph 630 shows the interpolated signal 628 as a function of time. As can be seen, the interpolated signal 628 has a phase between the first input signal 602 and the second input signal 604. An inductor 622 is connected to a ground 626 and to the first and second capacitances (606, 608) and for increasing a voltage and/or current level of the interpolated signal 628 via resonance with one or more of the first or second capacitances (606, 608). To provide further tuning of this resonance, an additional capacitance 624 is connected in parallel with the inductor 622.

An additional, active amplification stage 660 is connected with the inductor 622 for further boosting of the voltage and/or current level of the interpolated signal 628. The amplification stage 660 includes an input capacitor 659, a resistor 658, a first transistor 654, a second transistor 656 and an output capacitor 652. An amplified output signal 662 is thus created based on the interpolated signal 628. However, because of the passively increased signal level of the interpolated signal 628 due to the inductor 622, the active amplification stage 660 need not amplify the interpolated signal 628 as much as would otherwise be necessary. A plot 670 shows the output signal 662 as a function of time. Although the amplification stage 660 results in an inverted output signal 662 from the interpolated signal 628, any of a variety of amplification or buffering methods (producing inverted or non-inverted output signals) using a variety of the same, similar, or different circuit components may be utilized in an alternative embodiment.

Figure 7A:
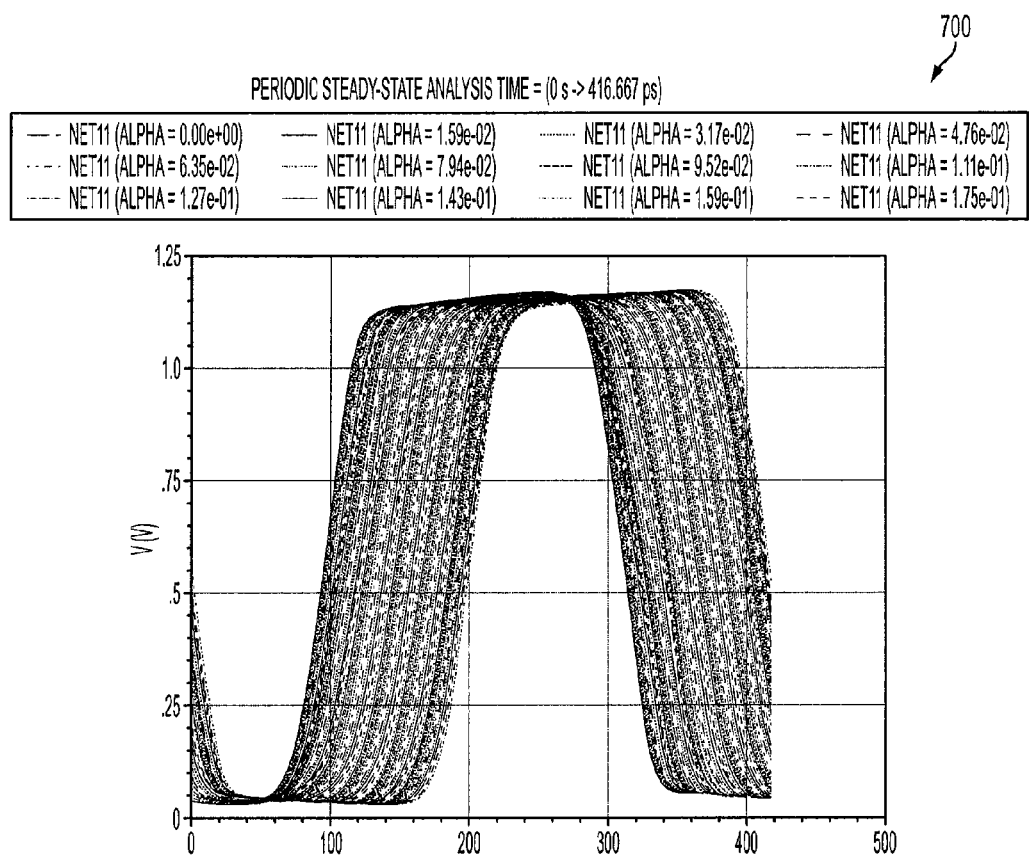
FIG. 7A is plot representing improved signal interpolation resolution of a phase interpolator utilizing capacitive injection with passive inductor-based amplification in accordance with an embodiment of the invention.

FIG. 7A shows a plot 700 showing high phase interpolation resolution that can be obtained with a phase interpolator utilizing capacitive injection with passive inductor-based amplification, for example, a phase interpolator implemented via one of the embodiments previously described in FIG. 3, 4, 5 or 6. The plot 700 shows a relationship between voltage and time for a plurality of interpolated signals from a 9-bit resolution phase interpolator (i.e. a maximum of $2^9$ or 512 phase increments). Such a large resolution allows for increasingly accurate interpolated signals where fine interpolation limited by capacitor matching can be achieved.

Figure 7B:
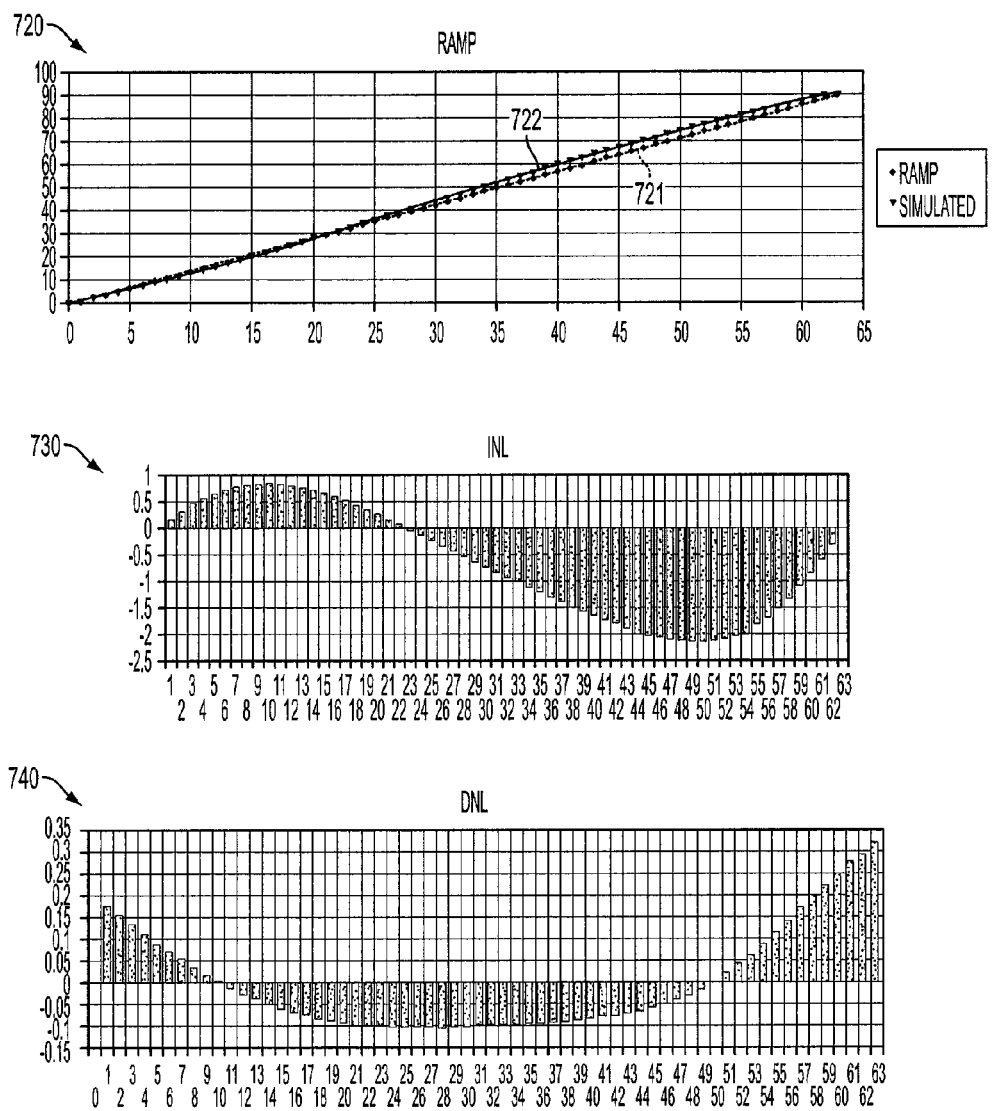
FIG. 7B is a plurality of plots representing improved signal deviation characteristics of a phase interpolator utilizing capacitive injection with passive inductor-based amplification in accordance with an embodiment of the invention.

FIG. 7B shows a plurality of plots for demonstrating the improved error mitigation of a phase interpolator utilizing capacitive injection with passive inductor-based amplification, for example, a phase interpolator implemented via one of the embodiments previously described in FIG. 3, 4, 5 or 6. A plot 720 shows decreased deviation from an ideal linear transfer curve 722 by an obtained signal 721. Such low deviation in the obtained signal 721 is again demonstrated in the integral nonlinearity plot 730 and in the differential nonlinearity plot 740. The integral nonlinearity plot 730 indicates the departure of the obtained signal 721 from the ideal linear transfer curve 722 for each phase increment. The differential nonlinearity plot 740 indicates the rate of deviation of the obtained signal 721 from the ideal for each phase increment. In an alternative embodiment, these nonlinearity errors may be further mitigated through the use of a look-up table incorporated into the phase interpolation circuit. For example, a table or other dataset may include a listing of known deviations from an ideal transfer curve for each increment of the phase component of an interpolated signal. During operation, after a user or other input has indicated a desired phase component for the interpolated signal, the phase interpolator circuit may reference the look-up table and automatically configure or adjust the switchably connected capacitances in accordance with the look-up table to remove any such deviation.

Exemplary embodiments of the invention have been disclosed in an illustrative style. Accordingly, the terminology employed throughout should be read in a non-limiting manner. Although minor modifications to the teachings herein will occur to those well versed in the art, it shall be understood that what is intended to be circumscribed within the scope of the patent warranted hereon are all such embodiments that reasonably fall within the scope of the advancement to the art hereby contributed, and that that scope shall not be restricted, except in light of the appended claims and their equivalents.

What is claimed is:

1. A phase interpolator comprising:
   a first circuit node for receiving a first signal having a first phase component;
   a second circuit node for receiving a second signal having a second phase component;
   a first capacitor having a first terminal and a second terminal, the first terminal of the first capacitor switchably coupled with the first circuit node;
   a second capacitor having a first terminal and a second terminal, the first terminal of the second capacitor switchably coupled with the second circuit node;
   a third circuit node coupled with the second terminal of the first capacitor and the second terminal of the second capacitor, the third circuit node configured to receive a third signal having a third phase component inclusively between the first phase component and the second phase component; and
   an inductor coupled with the third circuit node, the inductor configured to boost a voltage of the third signal.

2. The phase interpolator of claim 1 wherein the phase component of the second signal is substantially 90 degrees offset with respect to the first phase component.

3. The phase interpolator of claim 1 wherein one of the first capacitor and the second capacitor comprises a plurality of capacitors.

4. The phase interpolator of claim 3 wherein the plurality of capacitors are independently switchably coupled with the first circuit node or the second circuit node.

5. The phase interpolator of claim 1 further comprising an amplifier coupled with the inductor for further amplifying the voltage level of the third signal.

6. The phase interpolator of claim 5 wherein the inductor forms a resonant circuit with the first capacitor or the second capacitor.

7. The phase interpolator of claim 6 further comprising a tuning capacitor electrically connected in parallel with the inductor for tuning a frequency of the resonant circuit.

8. The phase interpolator of claim 7 wherein the tuning capacitor is a variable capacitance that is controllable for selecting different resonant frequencies.

9. The phase interpolator of claim 1 wherein the first capacitor and the second capacitor have different capacitance values for providing binary weighting.

10. The phase interpolator of claim 1 wherein the first capacitor and the second capacitor have the same capacitance values.

11. A phase interpolation circuit comprising:
    a first circuit node for conducting a first reference input signal;
    a first switch configured to conduct at least a portion of the first reference input signal from the first circuit node when in a conducting configuration;
    a first capacitor configured to receive the at least a portion of the first reference input signal when the first switch is in the conducting configuration;
    a second circuit node for conducting a second reference input signal having a 90 degree phase shift from the first reference input signal;
    a second switch configured to conduct at least a portion of the second reference input signal from the second circuit node when in a conducting configuration;
    a second capacitor configured to receive the at least a portion of the second reference input signal when the second switch is in the conducting configuration;
    a third circuit node for conducting a third reference input signal having a 180 degree phase shift from the first reference input signal;
    a third switch configured to conduct at least a portion of the third reference input signal from the third circuit node when in a conducting configuration;

a third capacitor configured to receive the at least a portion of the third reference input signal when the third switch is in the conducting configuration;

a fourth circuit node for conducting a fourth reference input signal having a 270 degree phase shift from the first reference input signal;

a fourth switch configured to conduct at least a portion of the fourth reference input signal from the fourth circuit node when in a conducting configuration;

a fourth capacitor configured to receive the at least a portion of the fourth reference input signal when the fourth switch is in the conducting configuration;

a fifth circuit node for conducting an interpolated signal having a phase component based on the configuration of the first switch, the second switch, the third switch and the fourth switch; and an inductor electrically connected to the first capacitor, the second capacitor, the third capacitor and the fourth capacitor and configured to form a resonant circuit with any of the first capacitor, the second capacitor, the third capacitor or the fourth capacitor.

12. The phase interpolator of claim 11 wherein the first capacitor, the second capacitor, the third capacitor and the fourth capacitor have different capacitance values for providing binary weighting of the at least a portion of the first reference input signal, the at least a portion of the second reference input signal, the at least a portion of the third reference input signal or the at least a portion of the fourth reference input signal.

13. The phase interpolator of claim 11 wherein the first capacitor, the second capacitor, the third capacitor and the fourth capacitor have substantially the same capacitance values.

14. The phase interpolator of claim 11 further comprising a tuning capacitor electrically connected in parallel with the inductor, the tuning capacitor configured to control a frequency of the resonant circuit.

15. A method of generating a signal with a controllable phase component, the method comprising the steps of:

providing a first capacitance switchably connected to a first circuit node;

providing a second capacitance switchably connected to a second circuit node;

receiving a first reference signal having a first phase component at the first capacitance when the first capacitance is connected to the first circuit node;

receiving a second reference signal having a second phase component at the second capacitance when the second capacitance is connected to the second circuit node;

generating an interpolated signal having a third phase component inclusively between the first phase component and the second phase component, the interpolated signal based on the switchable connection of the first capacitance and the second capacitance; and raising a voltage level of the interpolated signal via an inductor connected with at least one of the first capacitance or the second capacitance.

16. The method of claim 15 wherein the second phase component of the second reference signal is offset substantially 90 degrees from the first phase component of the first reference signal.

17. The method of claim 15 wherein the inductor is connected with both of the first capacitance and the second capacitance to form a resonant circuit.

18. The method of claim 15 wherein the first capacitance and the second capacitance have the same capacitance value for generating the interpolated signal via thermometer format capacitive weighting.

19. The method of claim 15 wherein the first capacitance and the second capacitance have different capacitance values for generating the interpolated signal via binary format capacitive weighting.

* * * * *